US010685784B2

(12) United States Patent
Yang

(10) Patent No.: US 10,685,784 B2
(45) Date of Patent: Jun. 16, 2020

(54) BACK-END-OF-THE LINE CAPACITOR

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/667,347

(22) Filed: Oct. 29, 2019

(65) Prior Publication Data

US 2020/0135407 A1 Apr. 30, 2020

Related U.S. Application Data

(62) Division of application No. 16/144,480, filed on Sep. 27, 2018, now Pat. No. 10,497,519.

(51) Int. Cl.
*H01G 4/33* (2006.01)
*H01G 4/30* (2006.01)
(Continued)

(52) U.S. Cl.
CPC ............. *H01G 4/33* (2013.01); *H01G 4/005* (2013.01); *H01G 4/008* (2013.01); *H01G 4/018* (2013.01);
(Continued)

(58) Field of Classification Search
CPC .......... H01G 4/33; H01G 4/008; H01G 4/018; H01G 4/30; H01G 4/224; H01G 4/005; H01L 23/5223
See application file for complete search history.

(56) References Cited

U.S. PATENT DOCUMENTS 5,675,184 A 10/1997 Matsubayashi et al.
5,879,985 A 3/1999 Gambino et al.
(Continued)

FOREIGN PATENT DOCUMENTS

CN 102412310 A 4/2012
GB 2129615 A1 5/1984

OTHER PUBLICATIONS

List of IBM Patents or Patent Applications Treated as Related dated Oct. 29, 2019, 2 pages.

*Primary Examiner* — Seahvosh Nikmanesh
(74) *Attorney, Agent, or Firm* — Scully, Scott, Murphy & Presser, P.C.; Alvin Borromeo, Esq.

(57) ABSTRACT

A back-end-of-the-line (BEOL) metal-insulator-metal (MIM) capacitor is provided that includes three electrode plates in which the first electrode plate of the MIM capacitor is an electrically conductive interconnect structure embedded in a first interconnect dielectric material layer. The other two electrode plates are located in a second interconnect dielectric material layer that is located above the first interconnect dielectric material layer. A first contact structure is present in the second interconnect dielectric material layer and contacts a surface of the first interconnect dielectric material layer, wherein the first contact structure passes through the second electrode plate. A second contact structure is also present in the second interconnect dielectric material layer and contacts a surface of the first electrode plate, wherein the second contact structure passes through the third electrode plate. Capacitor dielectric materials are located between each of the electrode plates.

18 Claims, 5 Drawing Sheets

(51) Int. Cl.
*H01L 23/522* (2006.01)
*H01G 4/018* (2006.01)
*H01G 4/008* (2006.01)
*H01G 4/005* (2006.01)
*H01G 4/224* (2006.01)

(52) U.S. Cl.
CPC .............. *H01G 4/224* (2013.01); *H01G 4/30* (2013.01); *H01L 23/5223* (2013.01)

(56) References Cited

U.S. PATENT DOCUMENTS

| | | |
|---|---|---|
| 6,198,153 B1 | 3/2001 | Liu et al. |
| 6,461,914 B1 | 10/2002 | Roberts et al. |
| 6,670,237 B1 | 12/2003 | Loh et al. |
| 6,764,915 B2 | 7/2004 | Lee et al. |
| 7,629,222 B2 | 12/2009 | Park et al. |
| 8,570,452 B2 | 10/2013 | Moriwaki |
| 8,906,773 B2 | 12/2014 | Ren et al. |
| 9,219,110 B2 | 12/2015 | Wang et al. |
| 9,312,326 B2 | 4/2016 | Jakushokas et al. |
| 9,437,557 B2 | 9/2016 | Mohammed et al. |
| 10,497,519 B1 * | 12/2019 | Yang ................ H01G 4/008 |
| 2008/0055816 A1 | 3/2008 | Park et al. |
| 2018/0197897 A1 | 7/2018 | Kin et al. |

* cited by examiner

BACK-END-OF-THE LINE CAPACITOR

BACKGROUND

The present application relates to a back-end-of-the-line (BEOL) metal-insulator-metal (MIM) capacitor and a method of forming the same. More particularly, the present application relates to a BEOL MIM capacitor that includes three electrode plates in which the first electrode plate of the MIM capacitor is an electrically conductive structure embedded in an interconnect dielectric material layer of a lower interconnect level.

On-chip capacitors including metal-insulator-metal (MIM) capacitors are essential for many semiconductor chips. For example, MIM capacitors are frequently utilized as decoupling capacitors for mitigating power supply or switching noise caused by changes in current flowing in an integrated chip. MIM capacitors are often integrated into a back-end-of-the-line (BEOL) metallization stack, at a position between an underlying first metallization layer and an overlying second metallization layer. When integrated, a MIM capacitor is commonly formed as a stacked structure including at least two planar electrode plates or three planar electrode plates. The various electrode plates in prior art BEOL MIM capacitors are generally embedded in an interconnect dielectric material layer that constitutes one of the interconnect levels of a multilevel interconnect structure. BEOL MIM capacitors that contain three planar electrode plates have better performance than BEOL MIM capacitors that contain two planar electrode plates.

Despite providing improved performance, BEOL MIM capacitors that contain three planar electrode plates are formed utilized complex processes in which topography related challenges are of one concern. Also, and when etching metal/high-k capacitor dielectric stacks, there is a challenge to control the contact via profile. There is thus a need to provide a BEOL MIM capacitor that contains three planar electrode plates utilizing a simplified method that reduces the topography related challenges and other problems that exist utilizing prior art methods of forming BEOL MIM capacitors that contain three planar electrode plates.

SUMMARY

A back-end-of-the-line (BEOL) metal-insulator-metal (MIM) capacitor is provided that includes three electrode plates in which the first electrode plate of the MIM capacitor is an electrically conductive interconnect structure embedded in a first interconnect dielectric material layer. The other two electrode plates are located in a second interconnect dielectric material layer that is located above the first interconnect dielectric material layer. A first contact structure is present in the second interconnect dielectric material layer and contacts a surface of the first interconnect dielectric material layer, wherein the first contact structure passes through the second electrode plate. A second contact structure is also present in the second interconnect dielectric material layer and contacts a surface of the first electrode plate, wherein the second contact structure passes through the third electrode plate. Capacitor dielectric materials are located between each of the electrode plates.

In one aspect of the present application, a back-end-of-the-line (BEOL) metal-insulator-metal (MIM) capacitor is provided. In one embodiment, the BEOL MIM capacitor includes a first electrode plate including an electrically conductive interconnect structure that is embedded in a first interconnect dielectric material layer. A first capacitor dielectric material is located above the electrically conductive interconnect structure and is embedded in a second interconnect dielectric material layer. A second electrode plate is located on the first capacitor dielectric material and is embedded in the second interconnect dielectric material layer. A second capacitor dielectric material is located on the second electrode plate and is embedded in the second interconnect dielectric material layer, wherein a surface of the second capacitor dielectric material contacts an outermost sidewall surface of the second electrode plate. A third electrode plate is located on the second capacitor dielectric material and is embedded in the second interconnect dielectric material layer. A first contact structure is present in the second interconnect dielectric material layer and contacts a surface of the first interconnect dielectric material layer, wherein the first contact structure passes through the second electrode plate and the first capacitor dielectric material. A second contact structure is present in the second interconnect dielectric material layer and contacts a surface of the first electrode plate, wherein the second contact structure passes through the third electrode plate and the second capacitor dielectric material.

In another aspect of the present application, a method of forming a back-end-of-the-line (BEOL) metal-insulator-metal (MIM) capacitor is provided. In one embodiment, the method includes forming an electrically conductive interconnect structure in a first interconnect dielectric material layer. A patterned capacitor material stack is formed above the electrically conductive interconnect structure and the first interconnect dielectric material layer, wherein the patterned capacitor material stack includes a first capacitor dielectric material a first metal-containing material, a second capacitor dielectric material and a second metal-containing material, wherein the second metal-containing material and the second capacitor dielectric material are located atop and overlap the first metal-containing material and the first capacitor dielectric material. A second interconnect dielectric material layer is formed laterally surrounding, and above the patterned capacitor material stack. A first contact structure is formed in the second interconnect dielectric material layer and contacting a surface of the first interconnect dielectric material layer, and a second contact structure is also formed in the second interconnect dielectric material layer and contacting a surface of the electrically conductive interconnect structure. In accordance with the present application, the first contact structure passes through first metal-containing material and the first capacitor dielectric material, and the second contact structure passes through second metal-containing material and the second capacitor dielectric material.

DETAILED DESCRIPTION

Figure 1:
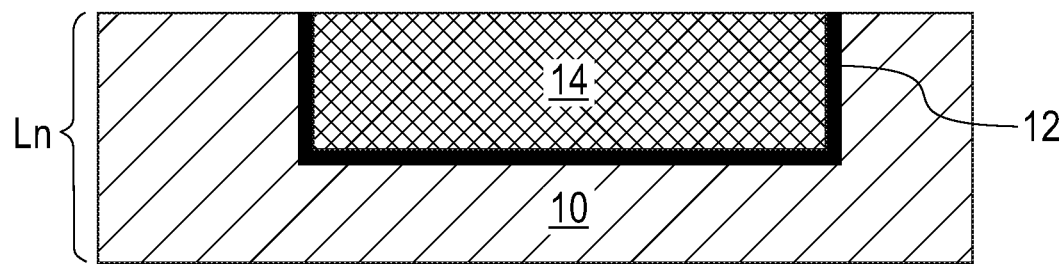
FIG. 1 is a cross sectional view of an exemplary BEOL MIM capacitor of the present application and during an early stage of fabrication, wherein the BEOL MIM capacitor includes a lower interconnect level including an electrically conductive interconnect structure embedded in an interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first FIG. 1, there is illustrated an exemplary BEOL MIM capacitor of the present application and during an early stage of fabrication, wherein the BEOL MIM capacitor includes a lower interconnect level, Ln, including an electrically conductive interconnect structure 14 embedded in an interconnect dielectric material layer 10. The electrically conductive interconnect structure 14 constitutes a first electrode plate of the BEOL MIM capacitor of the present application. In some embodiments, a diffusion barrier liner 12 is located between the electrically conductive interconnect structure 14 and the interconnect dielectric material layer 10. It is noted that the drawings of the present application merely illustrate a region of a structure in which a BEOL MIM capacitor is to be subsequently formed.

The lower interconnect level, Ln, represents one interconnect level of a multilayered interconnect structure in which n is an integer starting at 1. In one embodiment, the lower interconnect level, Ln, is a first interconnect level of a multilayered interconnect structure. In such an embodiment, a front-end-of-the-line (FEOL) device level (not shown) can be present directly beneath the lower interconnect level. The FEOL device level includes a semiconductor substrate and one or more semiconductor devices, such as, for example, transistors, resistors, diodes, and/or capacitors.

In another embodiment (also not shown), the lower interconnect level, Ln, represents one of the interconnect levels of a multilayered interconnect structure in which at least one additional interconnect level is present beneath the lower interconnect level, Ln, of FIG. 1. In such an embodiment, the at least one additional interconnect level includes an electrically conductive interconnect structure embedded in an interconnect dielectric material layer.

The interconnect dielectric material layer 10 of lower interconnect level, Ln, can be composed of an inorganic dielectric material or an organic dielectric material. In some embodiments, the interconnect dielectric material layer 10 may be porous. In other embodiments, the interconnect dielectric material layer 10 may be non-porous. Examples of suitable dielectric materials that can be employed as the interconnect dielectric material layer 10 include, but are limited to, silicon dioxide, undoped or doped silicate glass, silsesquioxanes, C doped oxides (i.e., organosilicates) that include atoms of Si, C, O and H, thermosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The interconnect dielectric material layer 10 may have a dielectric constant (all dielectric constants mentioned herein are measured relative to a vacuum, unless otherwise stated) that is about 4.0 or less. In one embodiment, the interconnect dielectric material layer 10 has a dielectric constant of 2.8 or less.

The interconnect dielectric material layer 10 may be formed by a deposition process such as, for example, chemical vapor deposition (CVD), plasma enhanced chemical vapor deposition (PECVD) or spin-on coating. The interconnect dielectric material layer 10 may have a thickness from 50 nm to 250 nm. Other thicknesses that are lesser than 50 nm, and greater than 250 nm can also be employed in the present application.

The electrically conductive interconnect structure 14 is formed into the interconnect dielectric material layer 10; although a single electrically conductive interconnect structure 14 is described and illustrated, a plurality of electrically conductive interconnect structures can be formed in the interconnect dielectric material layer 10. The electrically conductive interconnect structure 14 typically has a topmost surface that is coplanar with a topmost surface of the interconnect dielectric material layer 10. The electrically conductive interconnect structure 14 may extend throughout the entire thickness of the interconnect dielectric material layer 10, or it may extend partially through the interconnect dielectric material layer 10 as is shown in FIG. 1. As previously stated, the electrically conductive interconnect structure 14 represents a first electrode plate of the BEOL MIM capacitor of the present application.

The electrically conductive interconnect structure 14 can be formed by providing an opening (not shown) in the interconnect dielectric material layer 10, and then filling the opening with an electrically conductive metal or metal alloy. The opening that is formed into the interconnect dielectric material layer 10 may be a via opening, a line opening and/or a combined via/line opening. The opening can be formed by lithography and etching. In embodiments in which a combined via/line opening is formed, a second iteration of lithography and etching is used to form such a combined via/line opening. After forming the opening, the opening is filled with an electrically conductive metal or metal alloy. Examples of electrically conductive metals include, for example, copper (Cu), aluminum (Al), tungsten (W), or cobalt (Co). An example of an electrically conductive metal alloy that can be used is a copper-aluminum alloy. The electrically conductive metal or metal alloy may be formed utilizing a deposition process such as, for example, CVD, PECVD, sputtering, chemical solution deposition or plating. In one embodiment, a bottom-up plating process can be employed in filling each opening. In some embodiments, a planarization process such as, for example, chemical mechanical polishing (CMP) may follow the deposition of the electrically conductive metal or metal alloy.

In some embodiments, and prior to the deposition of the electrically conductive metal or metal alloy, a diffusion barrier material is formed in the opening and atop the interconnect dielectric material layer 10. The diffusion barrier material is composed of Ta, TaN, Ti, TiN, Ru, RuN, RuTa, RuTaN, W, WN or any other material that can serve as a barrier to prevent a conductive material from diffusing there through. The thickness of the diffusion barrier material may vary depending on the deposition process used as well as the material employed. In some embodiments, the diffusion barrier material may have a thickness from 2 nm to 50 nm; although other thicknesses for the diffusion barrier material are contemplated and can be employed in the present application as long as the diffusion barrier material does not entirely fill the opening. When present, the diffusion barrier material can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Following the deposition of the diffusion barrier material and the electrically conductive metal or metal alloy, and during the planarization of the electrically conductive metal or metal alloy, a portion of the diffusion barrier material as well as a portion of the electrically conductive metal or metal alloy that are located outside the opening and atop the interconnect dielectric material layer 10 are removed. The remaining portion of the diffusion barrier material in the opening can be referred to as a diffusion barrier liner 12, the remaining portion of the electrically conductive metal or metal alloy in the opening can be referred to as the electrically conductive interconnect structure 14. As is illustrated, the diffusion barrier liner 12 is U-shaped and is present between the electrically conductive interconnect structure 14 and the interconnect dielectric material layer 10. As is further shown, the electrically conductive interconnect structure 14 has a topmost surface that is typically coplanar with a topmost surface of the diffusion barrier liner 12 and with a topmost surface of the interconnect dielectric material layer 10.

Figure 2:
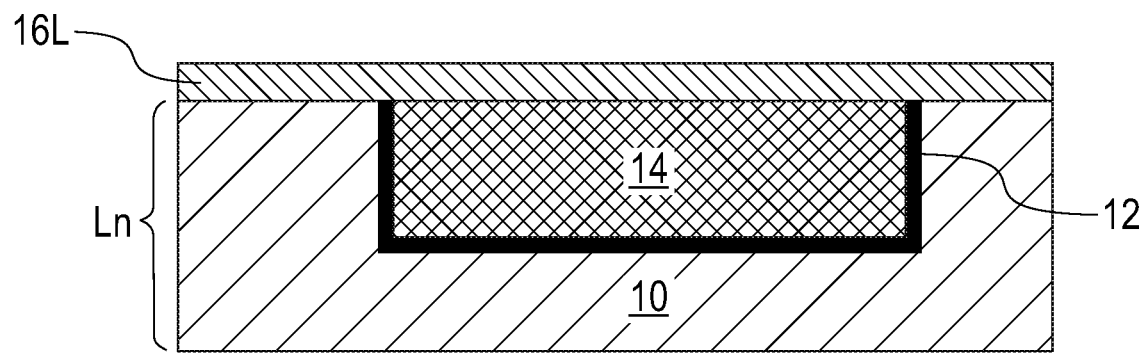
FIG. 2 is a cross sectional view of an exemplary BEOL MIM capacitor of FIG. 1 after forming a dielectric capping layer on the lower interconnect level.

Referring now to FIG. 2, there is illustrated the exemplary BEOL MIM capacitor of FIG. 1 after forming a dielectric capping layer 16L on the lower interconnect level, Ln. As is shown, the dielectric capping layer 16L is located on physically exposed topmost surfaces of the interconnect dielectric material layer 10, if present, the diffusion barrier liner 12, and the electrically conductive interconnect structure 14. In some embodiments (and as shown in the embodiment illustrated in FIG. 12), the dielectric capping layer 16L can be omitted.

When present, the dielectric capping layer 16L is composed of dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric capping layer 16L is typically compositionally different from the interconnect dielectric material layer 10. The dielectric material that provides the dielectric capping layer 16L can be formed utilizing a deposition process such as, for example, CVD, PECVD, atomic layer deposition (ALD), chemical solution deposition or evaporation. When present, dielectric capping layer 16L can have a thickness from 10 nm to 100 nm. Other thicknesses that are lesser than 10 nm, or greater than 100 nm may also be used as the thickness of the dielectric capping layer 16L.

Figure 3:
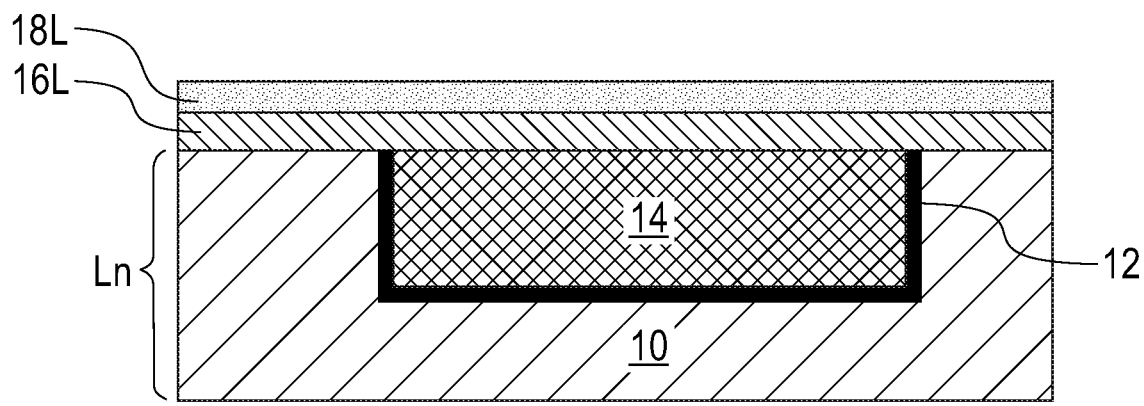
FIG. 3 is a cross sectional view of the exemplary BEOL MIM capacitor of FIG. 2 after forming a first capacitor dielectric material layer on the dielectric capping layer.

Referring now to FIG. 3, there is illustrated the exemplary BEOL MIM capacitor of FIG. 2 after forming a first capacitor dielectric material layer 18L on the dielectric capping layer 16L. In the illustrated embodiment, the first capacitor dielectric material layer 18L is a contiguous layer that is formed on an entire topmost surface of the dielectric capping layer 16L.

The first capacitor dielectric material layer 18L is composed of a dielectric oxide, a dielectric nitride, a dielectric oxynitride, or a composite stack layer thereof. In one example, the first capacitor dielectric material layer 18L can be composed of a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered composite stack of different dielectric materials, e.g., silicon dioxide, and a high-k dielectric, can be formed and used as the first capacitor dielectric material layer 18L.

The first capacitor dielectric material layer 18L can be formed by any deposition process including, for example, CVD, PECVD, PVD, ALD or sputtering. In one embodiment of the present application, the first capacitor dielectric material layer 18L can have a thickness in a range from 1 nm to 10 nm. Other thicknesses that are lesser than, or greater than, the aforementioned thickness range can also be employed for the thickness of the first capacitor dielectric material layer 18L.

Figure 4:
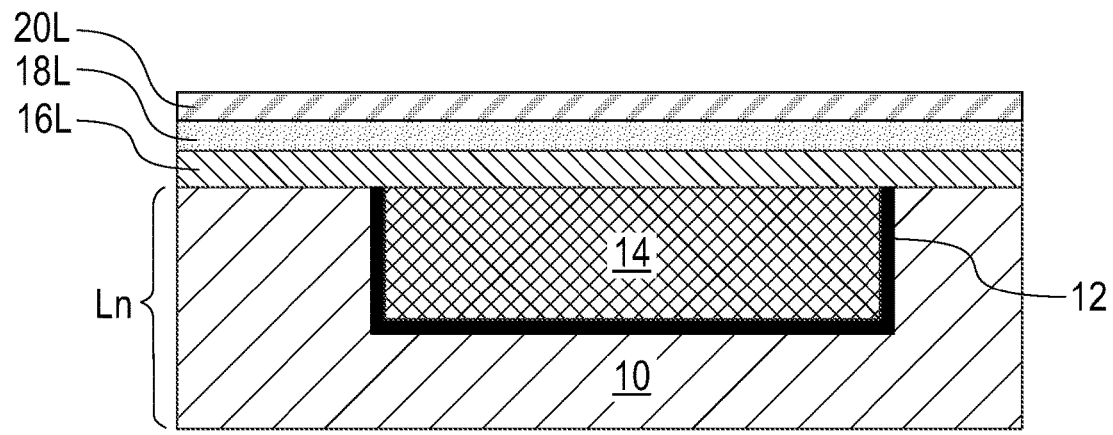
FIG. 4 is a cross sectional view of the exemplary BEOL MIM capacitor of FIG. 3 after forming a first metal-containing material layer on the first capacitor dielectric material layer.

Referring now to FIG. 4, there is illustrated the exemplary BEOL MIM capacitor of FIG. 3 after forming a first metal-containing material layer 20L on the first capacitor dielectric material layer 18L. The first metal-containing material layer 20L is a contiguous layer that is formed on an entire topmost surface of the first capacitor dielectric material layer 18L.

The first metal-containing material layer 20L can be composed of a conductive metal, a conductive metal nitride, or an alloy of conductive metals. Exemplary conductive materials that can be used as the first metal-containing material layer 20L can include tantalum (Ta), titanium (Ti), tungsten (W), copper (Cu), aluminum (Al), ruthenium (Ru), rhodium (Rh), cobalt (Co), titanium nitride (TiN), or tantalum nitride (TaN). The first metal-containing material layer 20L can be formed utilizing a deposition process including, for example, CVD, PECVD, physical vapor deposition (PVD), ALD, sputtering, or other like deposition processes. The first metal-containing material layer 20L may have a thickness from 10 nm to 50 nm; although other thicknesses are contemplated and can be used in the present application.

Figure 5:
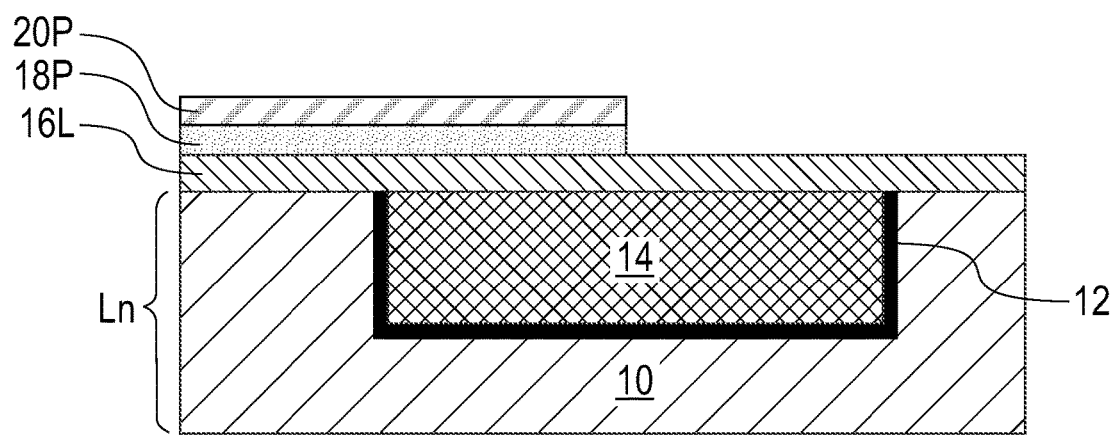
FIG. 5 is a cross sectional view of the exemplary BEOL MIM capacitor of FIG. 4 after patterning the first metal-containing material layer and the first capacitor dielectric material layer to provide a patterned material stack of a remaining portion of the first metal-containing material layer and a remaining portion of the first capacitor dielectric material layer.

Referring now to FIG. 5, there is illustrated the exemplary BEOL MIM capacitor of FIG. 4 after patterning the first metal-containing material layer 20L and the first capacitor dielectric material layer 18L to provide a patterned material stack of a remaining portion of the first metal-containing material layer 20L and a remaining portion of the first capacitor dielectric material layer 18L. In the present application, the remaining portion of the first metal-containing material layer 20L constitutes a first metal-containing material portion 20P of the patterned material stack, while the remaining portion of the first capacitor dielectric material layer 18L constitutes a first capacitor dielectric material portion 18P of the patterned material stack.

The patterned material stack (18P, 20P) has a portion that extends directly above the electrically conductive interconnect structure 14 that is embedded in the interconnect dielectric material layer 10. As is shown, the first capacitor dielectric material portion 18P of the patterned material stack has outermost sidewalls that are vertically aligned to outermost sidewalls of the overlying first metal-containing material portion 20P.

The patterning of the first metal-containing material layer 20L and the first capacitor dielectric material layer 18L can be performed by lithography and etching. Lithography includes applying a photoresist material (not shown) on a topmost surface of a material or material stack that needs to be patterned. The photoresist material is then exposed to a desired pattern of radiation and the exposed photoresist is then developed to provide a patterned photoresist having a pattern formed therein. The pattern of the patterned photoresist is then transferred to the underlying material or material stack by utilizing one or more anisotropic etching processes. In one embodiment, a reactive ion etch may be used to complete the pattern transfer. After transferring the pattern into the underlying material or material layers, the patterned photoresist is removed utilizing a conventional material removal process such as, for example, stripping or ashing.

Figure 6:
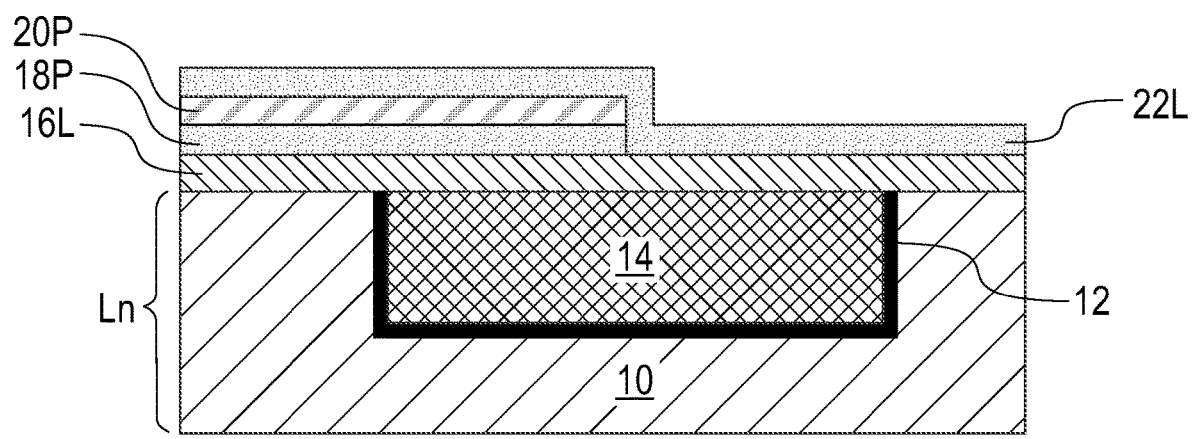
FIG. 6 is a cross sectional view of the exemplary BEOL MIM capacitor of FIG. 5 after forming a second capacitor dielectric material layer on physically exposed surfaces of the patterned material stack and on a physically exposed surface of the dielectric capping layer.

Referring now to FIG. 6, there is illustrated the exemplary BEOL MIM capacitor of FIG. 5 after forming a second capacitor dielectric material layer 22L on physically exposed surfaces (i.e., topmost and a sidewall) of the patterned material stack (18P, 20P) and on a physically exposed surface of the dielectric capping layer 16L. When the dielectric capping layer 16L is omitted, the second capacitor dielectric material layer 22L would be present on physically exposed surfaces of the lower interconnect level, Ln.

The second capacitor dielectric material layer 22L is a contiguous layer that is composed of one of the dielectric materials mentioned above for the first capacitor dielectric material layer 18L. In one embodiment of the present application, the second capacitor dielectric material layer 22L is composed of a same dielectric material as the dielectric material that provides the first capacitor dielectric material layer 18L. In such an embodiment, no material interface would exist between the second capacitor dielectric material layer 22L and the first capacitor dielectric material portion 18P of the patterned material stack. In another embodiment of the present application, the second capacitor dielectric material layer 22L is composed of a different dielectric material than the dielectric material that provides the first capacitor dielectric material layer 18L. In such an embodiment, a material interface would exist between the second capacitor dielectric material layer 22L and the first capacitor dielectric material portion 18P of the patterned material stack.

The second capacitor dielectric material layer 22L can be formed utilizing one of the deposition processes mentioned above in forming the first capacitor dielectric material layer 18L. The second capacitor dielectric material layer 22L may have a thickness within the thickness range mentioned above for the first capacitor dielectric material layer 18L.

Figure 7:
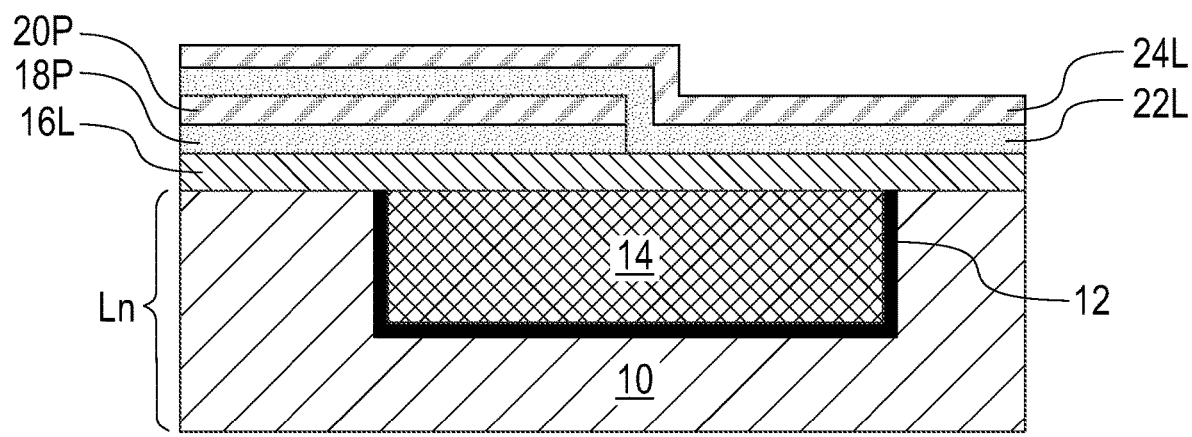
FIG. 7 is a cross sectional view of the exemplary BEOL MIM capacitor of FIG. 6 after forming a second metal-containing material layer on the second capacitor dielectric material layer.

Referring now to FIG. 7, there is illustrated the exemplary BEOL MIM capacitor of FIG. 6 after forming a second metal-containing material layer 24L on the second capacitor dielectric material layer 22L. The second metal-containing material layer 24L is a contiguous layer that is present on an entirety of the second capacitor dielectric material layer 22L.

The second metal-containing material layer 24L is composed of one of the conductive materials (i.e., metals, metal alloys or metal nitrides) mentioned above for the first metal-containing layer 20L. In one embodiment of the present application, the second metal-containing material layer 24L is composed of a same conductive material as the conductive material that provides the first metal-containing material layer 20L. In another embodiment of the present application, the second metal-containing material layer 24L is composed of a different conductive material than the conductive material that provides the first metal-containing material layer 20L.

The second metal-containing material layer 24L can be formed utilizing one of the deposition processes mentioned above in forming the first metal-containing material layer 20L. The second metal-containing material layer 24L may have a thickness within the thickness range mentioned above for the first metal-containing material layer 20L.

In some embodiments (not illustrated), additional alternating layers of a capacitor dielectric material and a metal-containing material can be formed atop the second metal-containing material layer 24L.

Figure 8:
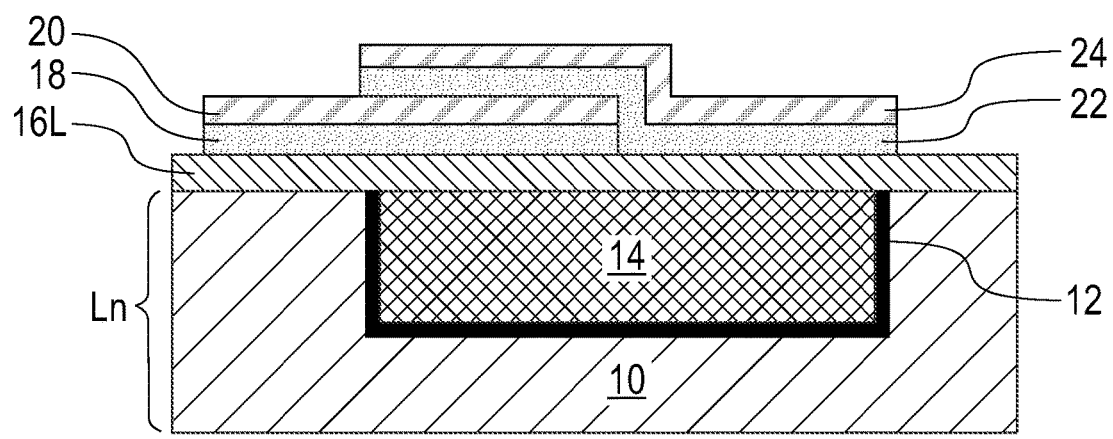
FIG. 8 is a cross sectional view of the exemplary BEOL MIM capacitor of FIG. 7 after patterning the second metal-containing material layer, the second capacitor dielectric material layer, and the patterned material stack of the first metal-containing material portion and the first capacitor dielectric material portion to provide a patterned capacitor material stack.

Referring now to FIG. 8, there is illustrated the exemplary BEOL MIM capacitor of FIG. 7 after patterning the second metal-containing material layer 24L, the second capacitor dielectric material layer 22L, and the patterned material stack (18P, 20P) of the first metal-containing material portion 20P and the first capacitor dielectric material portion 18P to provide a patterned capacitor material stack (18/20/22/24).

The patterned capacitor material stack includes a remaining portion of the second metal-containing material layer 24L (hereinafter second metal-containing material 24), a remaining portion of the second capacitor dielectric material layer 22L (hereafter second capacitor dielectric material 22), a remaining portion of the first metal-containing material portion 20P (hereinafter first metal-containing material 20), and a remaining portion of the first capacitor dielectric material portion 18P (hereinafter first capacitor dielectric material 18). As is shown, the second metal-containing material 24 and the second capacitor dielectric material 22 of the patterned capacitor material stack are located atop and overlap the first metal-containing material 20 and the first capacitor dielectric material 18 of the patterned capacitor material stack. In accordance with the present application, the first metal-containing material 20 constitutes a second electrode plate of the BEOL MIM capacitor of the present application, while the second metal-containing material 24 constitutes the third electrode plate of the BEOL MIM capacitor the present application.

The patterned capacitor material stack (18/20/22/24) can be formed by lithography and etching. The etching may include one or more anisotropic etching processes. The patterned capacitor material stack (18/20/22/24) has portions that layer above the electrically conductive interconnect structure 14. The second metal-containing material 24 of the patterned capacitor material stack (18/20/22/24) has outermost sidewall surfaces that are vertically aligned to the outermost sidewall surfaces of the second capacitor dielectric material 22 of the patterned capacitor material stack (18/20/22/24), while the first metal-containing material 20 of the patterned capacitor material stack (18/20/22/24) has outermost sidewall surfaces that are vertically aligned to the outermost sidewall surfaces of the first capacitor dielectric material 18 of the patterned capacitor material stack (18/20/22/24).

Figure 9:
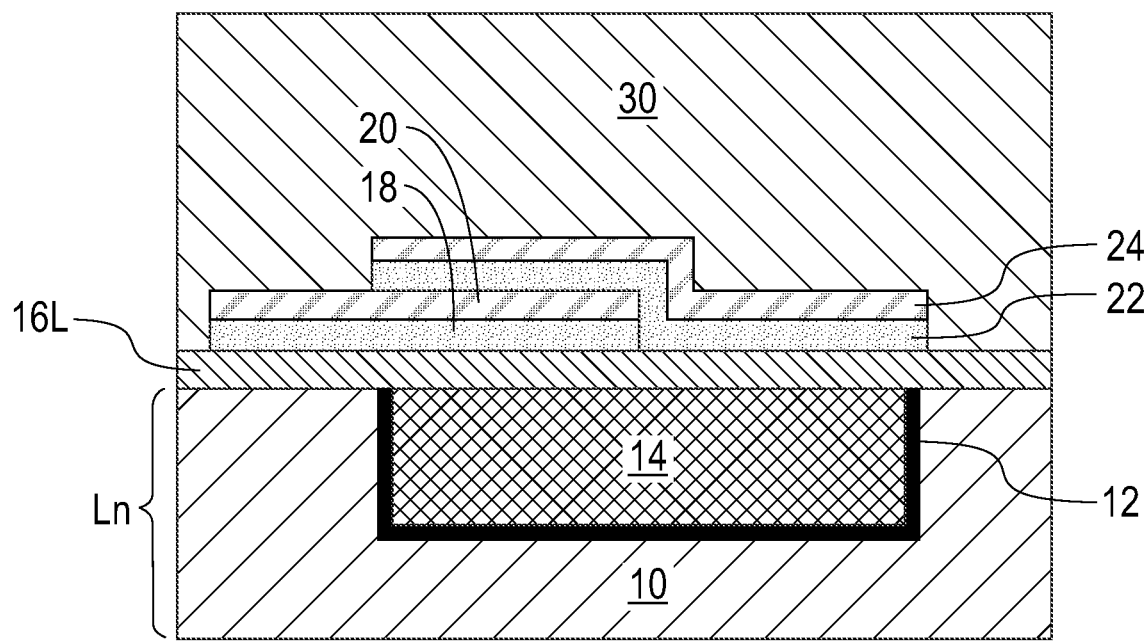
FIG. 9 is a cross sectional view of the exemplary BEOL MIM capacitor of FIG. 8 after forming another interconnect dielectric material layer surrounding physically exposed surfaces of the patterned capacitor material stack.

Referring now to FIG. 9, there is illustrated the exemplary BEOL MIM capacitor of FIG. 8 after forming another interconnect dielectric material layer 30 surrounding physically exposed surfaces of the capacitor material stack (18/20/22/24). In this embodiment of the present application, the another interconnect dielectric material layer 30 has a surface that directly contacts a physically exposed topmost surface of the dielectric capping layer 16L. In another embodiment, the another interconnect dielectric material layer 30 has a surface that directly contacts a physically exposed of interconnect dielectric material layer 10.

The another interconnect dielectric material layer 30 may be referred to as a second interconnect dielectric material layer, while the interconnect dielectric material layer 10 may be referred to as a first interconnect dielectric material layer. The another interconnect dielectric material layer 30 may include one of the interconnect dielectric materials mentioned above for the interconnect dielectric material layer 10. In one embodiment of the present application, the another interconnect dielectric material layer 30 is composed of a same interconnect dielectric material as the interconnect dielectric material that provides the first interconnect dielectric material layer 10. In another embodiment of the present application, the another interconnect dielectric material layer 30 is composed of a different interconnect dielectric material than the interconnect dielectric material that provides the first interconnect dielectric material layer 10.

The another interconnect dielectric material layer 30 can be formed utilizing one of the deposition processes mentioned above in forming the interconnect dielectric material layer 10. The another interconnect dielectric material layer 30 may have a thickness within the thickness range mentioned above for the interconnect dielectric material layer 10.

Figure 10:
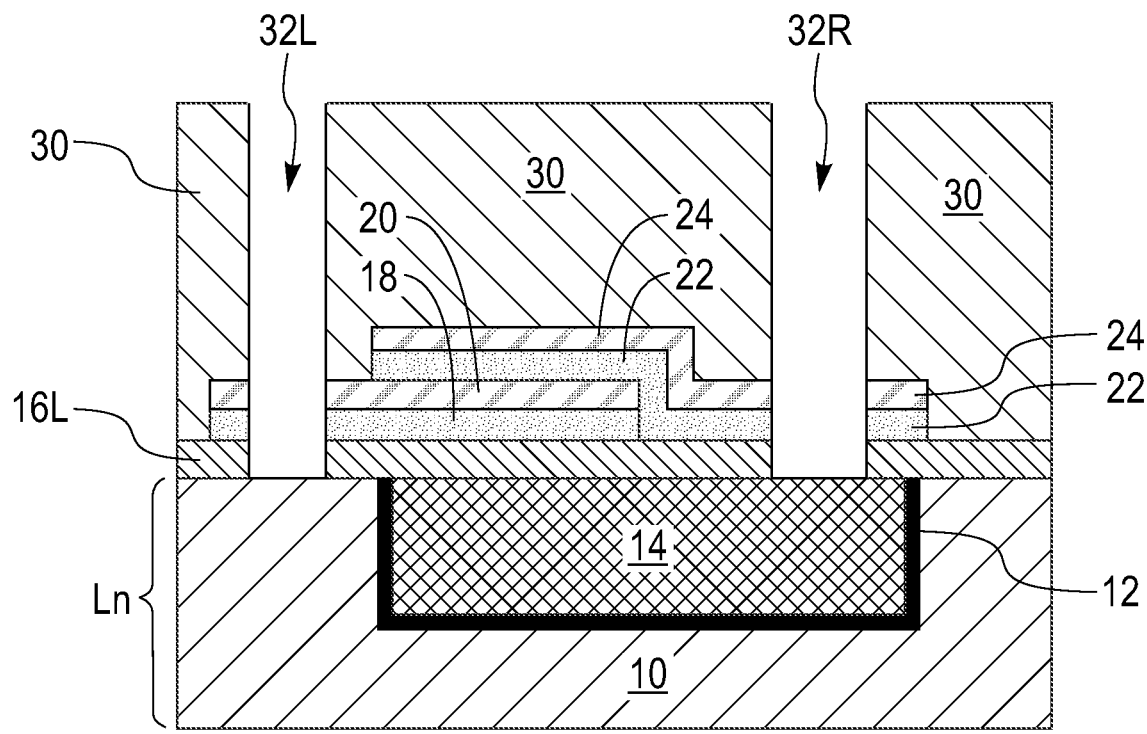
FIG. 10 is a cross sectional view of the exemplary BEOL MIM capacitor of FIG. 9 after forming a first contact opening that contacts the interconnect dielectric material layer of the lower interconnect level, and a second contact opening contacting a surface of the electrically conductive interconnect structure of the lower interconnect level.

Referring now to FIG. 10, there is illustrated the exemplary BEOL MIM capacitor of FIG. 9 after forming a first contact opening 32L that contacts the interconnect dielectric material layer 10 of the lower interconnect level, Ln, and a second contact opening 32R contacting a surface of the electrically conductive interconnect structure 14 of the lower interconnect level, Ln. The first and second contact openings (32L, 32R) can be formed by lithography and etching. The etching may include one or more anisotropic etching processes. In one example, one or more reactive ion etching processes can be used to provide the first and second contact openings (32L, 32R).

As is shown, the first contact opening 32L is formed into the another interconnect dielectric material layer 30, the first metal-containing material 20 (i.e., the second electrode plate), the first capacitor dielectric material 18, and if present, the dielectric capping layer 16L, stopping on a surface of the interconnect dielectric material layer 10. The second contact opening 32R is formed into the another interconnect dielectric material layer, the second metal-containing material 24 (i.e., the third electrode plate), the second capacitor dielectric material 22, and if present, the dielectric capping layer 16L, stopping on a surface of the electrically conductive interconnect structure 14 (i.e., the first electrode plate).

Generally, the first contact opening 32L is formed into odd number layers (first, third, fifth, etc.) of metal-containing materials and capacitor dielectric materials present in the another interconnect dielectric material layer 30, while the second contact opening 32R is formed into even numbers layers (second, fourth, etc.) of metal-containing materials and capacitor dielectric materials present in the another interconnect dielectric material layer 30.

Figure 11:
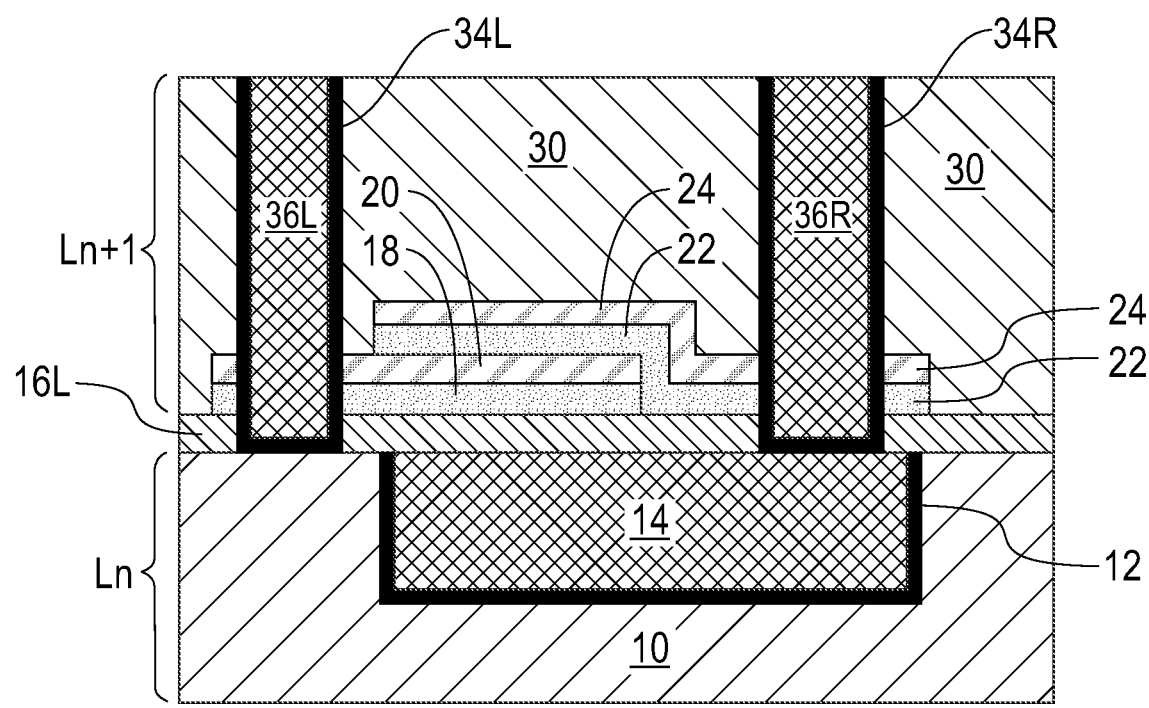
FIG. 11 is a cross sectional view of the exemplary BEOL MIM capacitor of FIG. 10 after forming a first contact structure in the first contact opening, and a second contact structure in the second contact opening.

Referring now to FIG. 11, there is illustrated the exemplary BEOL MIM capacitor of FIG. 10 after forming a first contact structure 36L in the first contact opening 32L, and a second contact structure 36R in the second contact opening 32R; in FIG. 11, Ln+1 denotes an upper interconnect level. In some embodiments and as illustrated in the drawing, a first diffusion barrier liner 34L may be also present in first contact opening 32L, and a second diffusion barrier liner 34R may be also present in the second contact opening 32R. In FIG. 11, element Ln+1 represents an upper interconnect level that includes the another interconnect dielectric material layer 30, the optional first and second diffusion barrier liners (34L, 34R) and the first and second contact structures (36L, 36R).

The optional first and second diffusion barrier liners (34L, 34R) may include one of the diffusion barrier materials mentioned above for diffusion barrier liner 12. The diffusion barrier material that provides the optional first and second diffusion barrier liners (34L, 34R) can be formed utilizing the technique mentioned above for forming the diffusion barrier material for diffusion barrier liner 12. The diffusion barrier material that provides the optional first and second diffusion barrier liners (34L, 34R) may have a thickness within the range mentioned above for the diffusion barrier material of diffusion barrier liner 12.

The first contact structure 36L and the second contact structure 36R may include one of the electrically conductive metals or metal alloys used in providing the electrically conductive interconnect structure 14. In one embodiment, the first and second contact structures (36L, 36R) are composed of a same electrically conductive metal or metal alloy as that which provides the electrically conductive interconnect structure 14. In another embodiment, the first and second contact structures (36L, 36R) are composed of a different electrically conductive metal or metal alloy as that which provides the electrically conductive interconnect structure 14. The electrically conductive metal or metal that provides the first contact structure 36L and the second contact structure 36R can be formed utilizing one of the deposition processes mentioned above for forming the electrically conductive metal or metal alloy that provides the electrically conductive interconnect structure 14.

Typically and as is illustrated, the first contact structure 36L has a topmost surface that is coplanar with a topmost surface of the second contact structure 36R as well as a topmost surface of the another interconnect dielectric material layer 30.

The optional first and second diffusion barrier liners (34L, 34R) and the first and second contact structures (36L, 36R) can be formed by first depositing a diffusion barrier material and then an electrically conductive metal or metal alloy into each of the first and second contact openings (32L, 32R), and thereafter performing a planarization process to remove the diffusion barrier material and the electrically conductive metal or metal alloy that is present outside of the first and second contact openings (32L, 32R).

Figure 12:
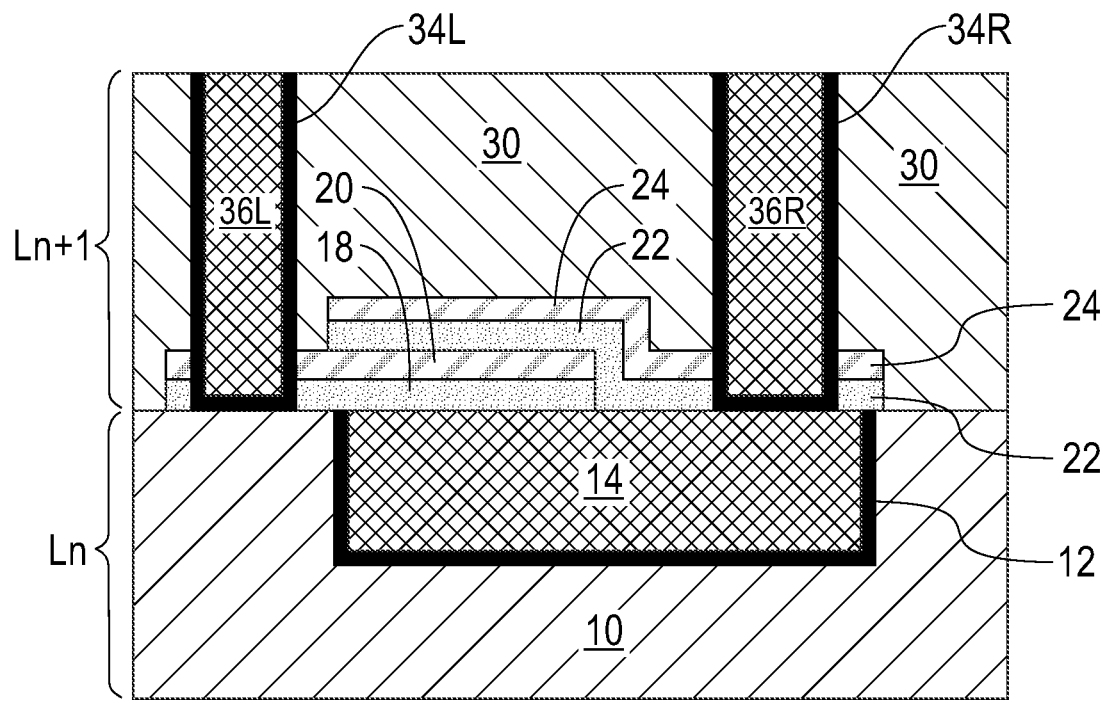
FIG. 12 is a cross sectional view of another exemplary BEOL MIM capacitor of the present application.

Referring now to FIG. 12, there is illustrated another exemplary BEOL MIM capacitor of the present application. The exemplary BEOL MIM capacitor that is illustrated in FIG. 12 includes the same elements/components as the exemplary BEOL MIM capacitor shown in FIG. 11 excerpt that no dielectric capping layer 16L is present in the final structure. The exemplary BEOL MIM capacitor of FIG. 12 can be formed utilizing the same basic processing steps as mentioned above in FIGS. 1-11 except that the step of forming a dielectric capping layer 16L illustrated in FIG. 2 is omitted in forming the exemplary BEOL MIM capacitor of FIG. 12.

Notably, FIGS. 11-12 illustrate exemplary BEOL MIM capacitors in accordance with the present application. Each BEOL MIM capacitor including a first electrode plate comprising an electrically conductive interconnect structure 14 that is embedded in a first interconnect dielectric material layer 10. A first capacitor dielectric material 18 is located above the first electrically conductive interconnect structure 14 and is embedded in a second interconnect dielectric material layer 30. A second electrode plate 20 is located on the first capacitor dielectric material 18 and is embedded in the second interconnect dielectric material layer 30. A second capacitor dielectric material 22 is located on the second electrode plate 20 and is embedded in the second interconnect dielectric material layer 30, wherein a surface of the second capacitor dielectric material 22 contacts an outermost sidewall surface of the second electrode plate 20. A third electrode plate 24 is located on the second capacitor dielectric material 22 and is embedded in the second interconnect dielectric material layer 30. A first contact structure 36L is present in the second interconnect dielectric material layer 30 and contacts a surface of the first interconnect dielectric material layer 10, wherein the first contact structure 36L passes through the second electrode plate 20 and the first capacitor dielectric material 18. A second contact structure 36R is present in the second interconnect dielectric material layer 30 and contacts a surface of the first electrode plate (i.e., element 14), wherein the second contact structure 36R passes through the third electrode plate 24 and the second capacitor dielectric material 22.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a back-end-of-the-line (BEOL) metal-insulator-metal (MIM) capacitor, the method comprising:
   forming an electrically conductive interconnect structure in a first interconnect dielectric material layer;
   forming a patterned capacitor material stack above the electrically conductive interconnect structure and the first interconnect dielectric material layer, wherein the patterned capacitor material stack comprises a first capacitor dielectric material, a first metal-containing material, a second capacitor dielectric material and a second metal-containing material, and wherein the second metal-containing material and the second capacitor dielectric material are located atop and overlap the first metal-containing material and the first capacitor dielectric material;
   forming a second interconnect dielectric material layer laterally surrounding, and located above the patterned capacitor material stack; and
   forming a first contact structure in the second interconnect dielectric material layer and contacting a surface of the first interconnect dielectric material layer, and a second contact structure in the second interconnect dielectric material layer and contacting a surface of the electrically conductive interconnect structure, wherein the first contact structure passes through first metal-containing material and the first capacitor dielectric material, and the second contact structure passes through second metal-containing material and the second capacitor dielectric material.

2. The method of claim 1, further comprising forming, prior to the forming of the patterned capacitor material stack, a dielectric capping layer on the electrically conductive interconnect structure and the first interconnect dielectric material layer.

3. The method of claim 1, wherein the first capacitor dielectric material has outermost sidewall surfaces that are vertically aligned to outermost sidewall surfaces of the first metal-containing material.

4. The method of claim 3, wherein the second capacitor dielectric material has outermost sidewall surfaces that are vertically aligned to outermost sidewall surfaces of the second metal-containing material.

5. The method of claim 1, wherein the forming of the patterned capacitor material stack comprises:
   forming a first capacitor dielectric material layer above the electrically conductive interconnect structure and the first interconnect dielectric material layer;
   forming a first metal-containing material layer on the first capacitor dielectric material layer;
   patterning the first metal-containing material layer and the first capacitor dielectric material layer to provide a patterned material stack of a remaining portion of the first metal-containing material layer and a remaining portion of the first capacitor dielectric material layer;

forming a second capacitor dielectric material layer on physically exposed surfaces of the patterned material stack;

forming a second metal-containing material layer on the second capacitor dielectric material layer; and patterning the second metal-containing material layer, the second capacitor dielectric material layer, and the patterned material stack of the first metal-containing material portion and the first capacitor dielectric material portion.

6. The method of claim 1, wherein the first capacitor dielectric material and the second capacitor dielectric material are composed of a same capacitor dielectric material.

7. The method of claim 1, wherein the first capacitor dielectric material and the second capacitor dielectric material are composed of different capacitor dielectric materials.

8. The method of claim 1, wherein each of the first capacitor dielectric material and the second capacitor dielectric material has a surface that directly contacts the electrically conductive structure.

9. The method of claim 1, wherein the first contact structure has a topmost surface that is coplanar with a topmost surface of second contact structure and a topmost surface of the second interconnect dielectric material layer.

10. The method of claim 1, wherein the first capacitor dielectric material is composed of a high-k dielectric material.

11. The method of claim 1, wherein the first metal-containing material is composed of tantalum (Ta), titanium (Ti), tungsten (W), copper (Cu), aluminum (Al), ruthenium (Ru), rhodium (Rh), cobalt (Co), titanium nitride (TiN) or tantalum nitride (TaN).

12. The method of claim 1, wherein the second capacitor dielectric material is composed of a high-k dielectric material.

13. The method of claim 1, wherein the second metal-containing material is composed of tantalum (Ta), titanium (Ti), tungsten (W), copper (Cu), aluminum (Al), ruthenium (Ru), rhodium (Rh), cobalt (Co), titanium nitride (TiN) or tantalum nitride (TaN).

14. The method of claim 1, wherein the patterned capacitor material stack further includes alternating layers of a capacitor dielectric material and a metal-containing material located on the second metal-containing material.

15. The method of claim 1, wherein the electrically conductive interconnect structure is composed of copper (Cu), aluminum (Al), tungsten (W), cobalt (Co) or alloys thereof.

16. The method of claim 1, wherein the first contact structure and the second contact structure are composed of copper (Cu), aluminum (Al), tungsten (W), cobalt (Co) or alloys thereof.

17. The method of claim 1, wherein the forming of the first contact structure and the second contact structure comprises:

forming, by lithography and etching, a first contact opening in the second interconnect dielectric material that physically exposes the first interconnect dielectric material layer, and a second contact opening in the second interconnect dielectric material layer that physically exposes the electrically conductive structure; and forming a layer of an electrically conductive metal or electrically conductive metal alloy on the second interconnect dielectric material layer and in both the first contact opening and the second contact opening;

removing, by planarization, the layer of electrically conductive metal or electrically conductive metal alloy that is located on the second interconnect dielectric material layer, while maintaining the layer of electrically conductive metal or electrically conductive metal alloy in both the first contact opening and the second contact opening.

18. The method of claim 17, further comprising forming, prior to forming the layer of electrically conductive metal or electrically conductive metal alloy, a diffusion barrier material layer on the second interconnect dielectric material and in both the first contact opening and the second contact opening, and wherein the diffusion barrier material layer that is located on the second interconnect dielectric material is removed during the planarization, while the layer of diffusion barrier material is maintaining in both the first contact opening and the second contact opening.

* * * * *